(12) United States Patent
Özdemir

(10) Patent No.: US 11,201,589 B2
(45) Date of Patent: Dec. 14, 2021

(54) COMBINED MIXER AND FILTER CIRCUITRY

(71) Applicant: Telefonaktiebolaget LM Ericsson (publ), Stockholm (SE)

(72) Inventor: Ufuk Özdemir, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/765,204

(22) PCT Filed: Dec. 8, 2017

(86) PCT No.: PCT/EP2017/082090
§ 371 (c)(1),
(2) Date: May 19, 2020

(87) PCT Pub. No.: WO2019/110128
PCT Pub. Date: Jun. 13, 2019

(65) Prior Publication Data
US 2020/0280284 A1    Sep. 3, 2020

(51) Int. Cl.
*H03D 7/14*    (2006.01)
*H03H 11/04*    (2006.01)

(52) U.S. Cl.
CPC ........... *H03D 7/1483* (2013.01); *H03H 11/04* (2013.01)

(58) Field of Classification Search
CPC .............................. H03D 7/1483; H03H 11/04
See application file for complete search history.

(56) References Cited

U.S. PATENT DOCUMENTS

| | | | | |
|---|---|---|---|---|
| 7,135,932 B2 * | 11/2006 | Quadir | ................... | H03F 3/082 330/308 |
| 7,202,726 B2 * | 4/2007 | Kunanayagam | ..... | H03H 11/265 327/274 |
| 7,902,917 B2 * | 3/2011 | Mirzaei | ................... | H03H 7/12 327/558 |
| 8,289,067 B2 * | 10/2012 | Kucharski | ............. | H03H 11/48 327/427 |
| 8,406,723 B1 | 3/2013 | Lobo et al. | | |

(Continued)

FOREIGN PATENT DOCUMENTS

DE    10012519 A1    10/2001
EP    0915565 A2    5/1999

OTHER PUBLICATIONS

Avitabile, G. et al., "A 18 GHz MMIC Biquad Active Filter", Jan. 1, 2002, pp. 1-3.

(Continued)

*Primary Examiner* — Dinh T Le
(74) *Attorney, Agent, or Firm* — Coats & Bennett, PLLC

(57) ABSTRACT

A combined mixer and filter circuitry is disclosed. The combined mixer and filter circuitry comprises a mixer comprising a first input, a second input and an output. The combined mixer and filter circuitry further comprises a filter comprising an active inductor and a first capacitor. The active inductor comprises a transistor having a first terminal, a second terminal and a third terminal and a resistor connected between the first terminal of the transistor and a voltage potential. The first capacitor is connected between the third terminal and a signal ground and the second terminal of the transistor is connected to the second input of the mixer.

8 Claims, 7 Drawing Sheets

(56) References Cited

U.S. PATENT DOCUMENTS

| | | | |
|---|---|---|---|
| 8,588,726 B2* | 11/2013 | Connell | H03D 7/165 455/326 |
| 9,197,257 B2* | 11/2015 | Axholt | H03D 7/165 |
| 2004/0057537 A1 | 3/2004 | Kim et al. | |
| 2009/0190692 A1 | 7/2009 | Aniruddhan et al. | |
| 2016/0380618 A1 | 12/2016 | Lu et al. | |

OTHER PUBLICATIONS

Andriesei, C., "Study of Active Filters Topologies for Telecommunications Applications", Cergy-Pontoise University PhD Thesis, Jan. 27, 2011, pp. 1-173, Cergy-Pontoise University.

Pirola, A. et al., "Current-Mode, WCDMA Channel Filter With In-Band Noise Shaping", IEEE Journal of Solid-State Circuits, vol. 45 No. 9, Sep. 1, 2010, pp. 1770-1780, IEEE.

Takahashi, Y. et al., "On Chip LC Resonator Circuit Using an Active Inductor for Adiabatic Logic", 2009 52nd IEEE International Midwest Symposium on Circuits and Systems, Aug. 2, 2009, pp. 1171-1174, IEEE.

Hara, S. et al., "Lossless, Broadband Monolithic Microwave Active Inductors", IEEE MTT-S International Microwave Symposium Digest, Jun. 13, 1989, pp. 955-958, IEEE.

\* cited by examiner

COMBINED MIXER AND FILTER CIRCUITRY

TECHNICAL FIELD

Embodiments herein relate to a combined mixer and filter circuitry. In particular, they relate to a mixer combined with a low-pass-filter (LPF) implemented by using active inductor.

BACKGROUND

Wireless communication systems usually comprise complex chains of transmitter and receiver circuits, including several frequency conversion steps. The transmitter circuits typically up-convert baseband signals to Radio Frequency (RF) signals for transmission, and the receiver circuits down-convert received RF signals to baseband signals for processing. Such frequency conversion requires mixers to mix two frequency signals.

Analog low pass filters are used as anti-alias filters after digital-to-analog converters (DACs) in transmitters and in-front of analog-to-digital converters (ADCs) in receivers. Usually they are implemented as op-amps with feedback elements generating complex poles to suppress alias frequencies effectively while passing signal with minimum distortion. Other alternatives are to use active or passive components like inductors, capacitors and resistors to form these filters. However, most applications require the poles to be complex to reach the required attenuation at the stop band while keeping pass-band gain droop at minimum. A real pole gives 3 dB attenuation at pole frequency, e.g. if 3rd order filtering is needed to reach the required stop band attenuation, this will cause 9 dB attenuation at pole frequency, if all poles are at the same location, which means an unavoidable, significant "gain droop" in the passband.

A usual way to generate complex poles is to use an op-amp in feedback configuration. However, with increasing signal bandwidths this comes at a high price of current consumption. The reason is that the op-amp requires 5-10 times higher bandwidth than the signal bandwidth, referred as Unity Gain Bandwidth (UGB) or Gain Bandwidth Product (GBP), in order to keep the loop gain high in the pass band. If high order filters are required, more op-amps are needed increasing current consumption even further. For example, nowadays Base Transceiver Station (BTS) requirements on 5 G products are 400 MHz Instantaneous Bandwidth (IBW) and there are even discussions on 800 MHz IBW, which means 200 MHz base-band BW on In-phase and Quadrature-phase signal. This means Digital Pre-Distortion (DPD) bandwidth will be higher. Depending on the linearity requirement which sets how high loop gain needs to be, this means the op-amp needs to have a UGB about 3-6 GHz. If 800 MHz IBW is required, this might need to be doubled, which makes it difficult to achieve even at high current consumption.

Another way to generate complex poles is to use transconductance-capacitance (gm-C) type filters. Unfortunately, they have poor linearity at low supply voltages due to large input and output voltage swings.

It is also possible to generate complex poles by using passive inductor (L), capacitor (C) components. The drawback with this solution is the silicon area. Since signal bandwidths in discussion are still below 1 GHz, each integrated inductor needs large silicon area, which makes this option unattractive for integrated circuits.

SUMMARY

Therefor it is an object of embodiments herein to provide an improved technique to generate complex poles for filter circuitry.

According to one aspect of embodiments herein, the object is achieved by a combined mixer and filter circuitry. The combined mixer and filter circuitry comprises a mixer comprising a first input, a second input and an output. The combined mixer and filter circuitry further comprises a filter comprising an active inductor and a first capacitor. The active inductor comprises a transistor having a first terminal, a second terminal and a third terminal and a resistor connected between the first terminal of the transistor and a voltage potential. The first capacitor is connected between the third terminal and a signal ground and the second terminal of the transistor is connected to the second input of the mixer.

According to one aspect of embodiments herein, the object is achieved by a combined mixer and filter circuitry. The combined mixer and filter circuitry comprises a mixer comprising a first input, a second input and an output. The combined mixer and filter circuitry further comprises a filter comprising an active inductor and a first capacitor. The active inductor comprises a transistor having a first terminal, a second terminal and a third terminal and a resistor connected between the first terminal of the transistor and a voltage potential, the first capacitor is connected between the third terminal and a signal ground, and the third terminal of the transistor is connected to the output of the mixer.

In other words, according to the embodiments herein, a low pass filter is implemented by using Hara's active inductor. This makes it possible to generate complex poles with moderate inductor quality factor (Q). Since the filter is combined with the mixer, it re-uses direct currents (DC) of the existing blocks, so it has virtually no current consumption.

The filter can reaches high bandwidth by virtually consuming no extra current. It may only require about 200 mV voltage supply headroom depending on the required Q of the complex poles.

The circuitry inherently has high bandwidth, as the traditional trade-off between bandwidth and current consumption does not exist in this topology.

Further, bandwidth may be scalable by switching capacitors and resistors, which makes it possible to fit into different products having various IBWs.

The solution according to embodiments herein is robust compared to op-amp based solutions, since there no feedback loops, neither differential nor common mode, which eliminates stability issues.

It is simple, no bias voltages and reference currents etc. are required.

Therefore, the combined mixer and filter circuitry according to embodiments herein provides an improved technique to generate complex poles for filter circuitry.

BRIEF DESCRIPTION OF THE DRAWINGS

Examples of embodiments herein are described in more detail with reference to attached drawings in which.

DETAILED DESCRIPTION

As a part of developing embodiments herein, function, principle and some issues of a Hara's active inductor according to prior art will first be discussed and identified. The Hara's active inductor is well known since the 80s, which is proposed as VCO resonators or microwave filters.

Small signal equivalent circuit and formulas to calculate values for Complementary Metal-Oxide-Semiconductor (CMOS) implementation of the Hara's active inductor can be found in Takahashi et. al, "*On Chip LC Resonator Circuit Using an Active Inductor for Adiabatic Logic*", $52^{nd}$ IEEE International Midwest Symposium on Circuits and Systems, 2009.

Please note that, besides a pole it also introduces a zero, which might be misleading at first glance. One might think that it has no use as a filter since a pole and a zero cancel each other, causing an all pass behaviour. However, the key point is, by combining the inductor with a shunt capacitor, a complex pole pair can be generated with a high Q. Since the parasitic zero is a real one, it can be cancelled out by a real pole, i.e. a second shunt capacitor. So, one can get a 2nd order system with complex poles by combining Hara's inductor with two shunt capacitors.

In A. Pirola et.al, "*Current-Mode, WCDMA Channel Filter With In-Band Noise Shaping*", IEEE Journal of Solid-State Circuits, Vol. 45 (9), Sept. 2010, a similar active inductor is realized through a network formed by two transistors and one capacitor. A filter is implemented using the active inductor and another capacitor. The implementation is a current mode filter in the filter core. However it is converted to a voltage mode filter by input and output resistors.

Figure 1A:
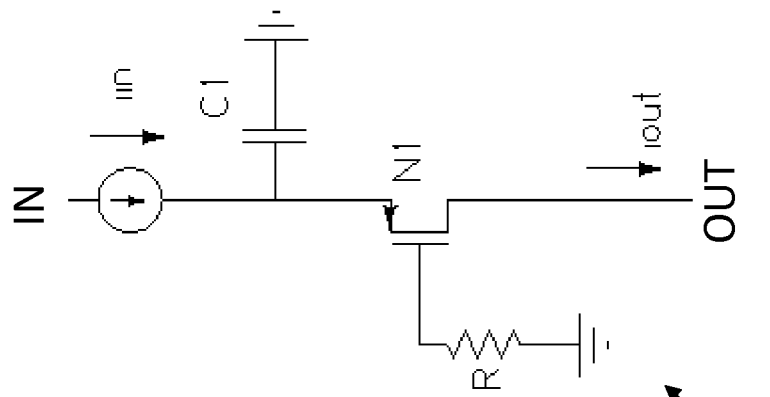
FIG. 1a and 1b are schematic views of filter core, i.e. an active inductor combined with a shunt capacitor according to prior art.
Figure 1B:
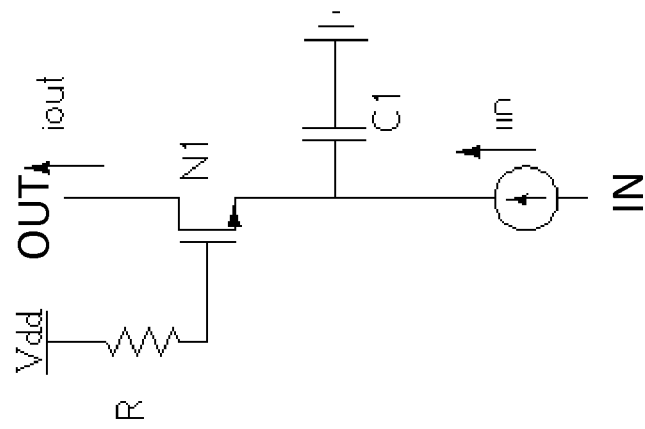

FIG. 1a and 1b show a simplified schematic of a filter core 100, i.e. Hara's active inductor combined with a shunt capacitor, where FIG. 1a is implemented by PMOS transistor and FIG. 1b is implemented by NMOS transistor. As shown in FIG. 1, transistor N1 and resistor R form an active Inductor. When this inductor is combined with shunt capacitor C1, it is possible to get complex poles. The transistor N1 may also be implemented by bipolar transistors. The source/emitter of the transistor N1 is input of the filter core 100. The Drain/collector of the transistor N1 is the output of the filter core 100. When gate/base of the transistor N1 is connected to a small signal ground via resistor R, the impedance seen from the input terminal is inductive at some frequencies, i.e. the transistor N1 and R behave like an Inductor. Note that the transistor N1 needs to be conducting current, so direct current (DC) wise the gate/base terminal must be biased to a correct voltage potential, e.g. for NMOS or bipolar NPN devices, R shall be connected to high supply voltage and for PMOS/bipolar PNP devices, R shall be connected to ground. When this synthetic inductor is combined with a shunt capacitor, it generates complex poles.

Figure 2:
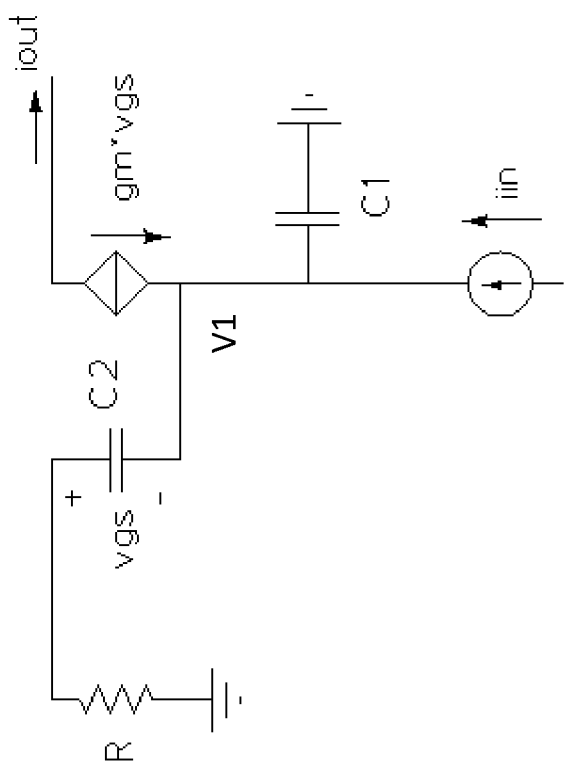
FIG. 2 is a small signal equivalent circuit view of the filter core shown in FIG. 1.

FIG. 2 shows a small signal equivalent circuit of the filter core 100, i.e. Hara's active inductor combined with a shunt capacitor. Derivation of a transfer function H(s) between input iin and output iout for the filter core 100 is as following with reference to FIG. 2.

$$i_{out} = -g_m \cdot v_{gs} \quad (1)$$

$$-v_{gs} = \frac{i_{out}}{g_m} \quad (1)'$$

$$i_{in} = i_{out} + \frac{v_1}{Z_1} + \frac{v_1}{(Z_2 + R)} \quad (2)$$

Where, $$Z_1 = \frac{1}{sC_1}, \quad (3)$$

$$Z_2 = \frac{1}{sC_2} - v_{gs} = v_1 \cdot \frac{Z_2}{(Z_2 + R)}$$

$$v_1 = -v_{gs} \cdot \frac{(Z_2 + R)}{Z_2} \quad (3)'$$

Insert Eq. (1)' into Eq. (3)':

$$v_1 = \frac{i_{out}}{g_m} \cdot \frac{(Z_2 + R)}{Z_2} \quad (4)$$

Insert Eq. (4) into Eq. (2)

$$i_{in} = i_{out} + \frac{i_{out}}{g_m} \cdot \frac{(Z_2 + R)}{Z_2} \cdot \frac{1}{Z_1} + \frac{i_{out}}{g_m} \cdot \frac{(Z_2 + R)}{Z_2} \cdot \frac{1}{(Z_2 + R)} = \quad (5)$$

$$i_{out} \cdot \left[1 + \frac{(Z_2 + R)}{g_m \cdot Z_2 \cdot Z_1} + \frac{1}{g_m \cdot Z_2}\right] = i_{out} \cdot \left[\frac{g_m \cdot Z_2 \cdot Z_1 + Z_2 + R + Z_1}{g_m \cdot Z_2 \cdot Z_1}\right]$$

$$\frac{i_{out}}{i_{in}} = \left[\frac{g_m \cdot Z_1 \cdot Z_2}{g_m \cdot Z_1 \cdot Z_2 + Z_1 + Z_2 + R}\right]$$

Insert $$Z_1 = \frac{1}{sC_1}, Z_2 = \frac{1}{sC_2} \text{ into Eq. (5):}$$

$$H(s) =$$

$$\frac{i_{out}}{i_{in}} = \left[\frac{\frac{g_m}{s^2 c_1 c_2}}{\frac{g_m}{s^2 c_1 c_2} + \frac{1}{sC_1} + \frac{1}{sC_2} + R}\right] = \left[\frac{g_m}{s^2 R C_1 C_2 + s(C_1 + C_2) + g_m}\right]$$

$$= \left[\frac{1}{s^2 \left(\frac{RC_1 C_2}{g_m}\right) + s\left(\frac{C_1 + C_2}{g_m}\right) + 1}\right]$$

$$= \left[\frac{N(s)}{s^2 \left(\frac{1}{\omega_0^2}\right) + s\left(\frac{1}{Q \cdot \omega_0}\right) + 1}\right]$$

Where, $$\omega_0 = \sqrt{\frac{g_m}{RC_1C_2}}, Q = \frac{\sqrt{g_m RC_1C_2}}{C_1 + C_2},$$

and C2 is the gate to source capacitor Cgs.

Please note that this derivation ignores transistor's drain to source capacitor Cds and gate to drain capacitor Cgd for simplicity. In fact, Cds generates complex zeros which are at very high frequency and may be ignored. However Cgd generates a real-valued zero which is in close vicinity of the complex poles, and may not be ignored.

A simple test bench was made to verify the derived analytical expressions for H(s), $\omega_o$ and Q. Table 1 shows calculated fo and Q based on derived formulas.

TABLE 1

| gm, S | R, Ohm | C1, F | C2, F | $w_o$, rad/s | fo, GHz | Q |
|---|---|---|---|---|---|---|
| 2.00E−02 | 1500 | 4.00E−12 | 8.00E−14 | 6454972244 | 1.02734074 | 7.59E−01 |

The simulation results agree well with the derived formulas. For example, the simulated Q is 7.443E−01, and the attenuation in the stop band has a slope of 12 dB/octave reflecting the $2^{nd}$ order filter's behavior. Note that, also in simulation Cgd and Cds are set to very small values, e.g. aF, to ignore their effects. As said before, Cgd causes a real-valued zero which deteriorates the filter order and stop band suppression.

Note that the filter core 100 shown in FIGS. 1a and 1b is very simple and robust. It requires no biasing circuitry, no common mode regulation and if DC current is high enough for the required Q, hence gm, it may be integrated to many blocks without consuming any extra current. The only resource it needs is about 200 mV headroom from the voltage supply (Vds). The transistor N1 can be used in saturation, subthreshold or even in triode region which indeed generates lowest noise.

If there is enough supply voltage headroom, it is even possible to stack such structures on top of each other to increase filter order. Of course, in that case the poles are not isolated and "push" each other as in a passive network topology. This might be mitigated by using isolation resistors or transistors between or completely avoided by using current mirrors to get high filter orders while keeping all poles at the same frequency. But that would mean, the filter will consume current due to the mirrored branch.

Figure 3:
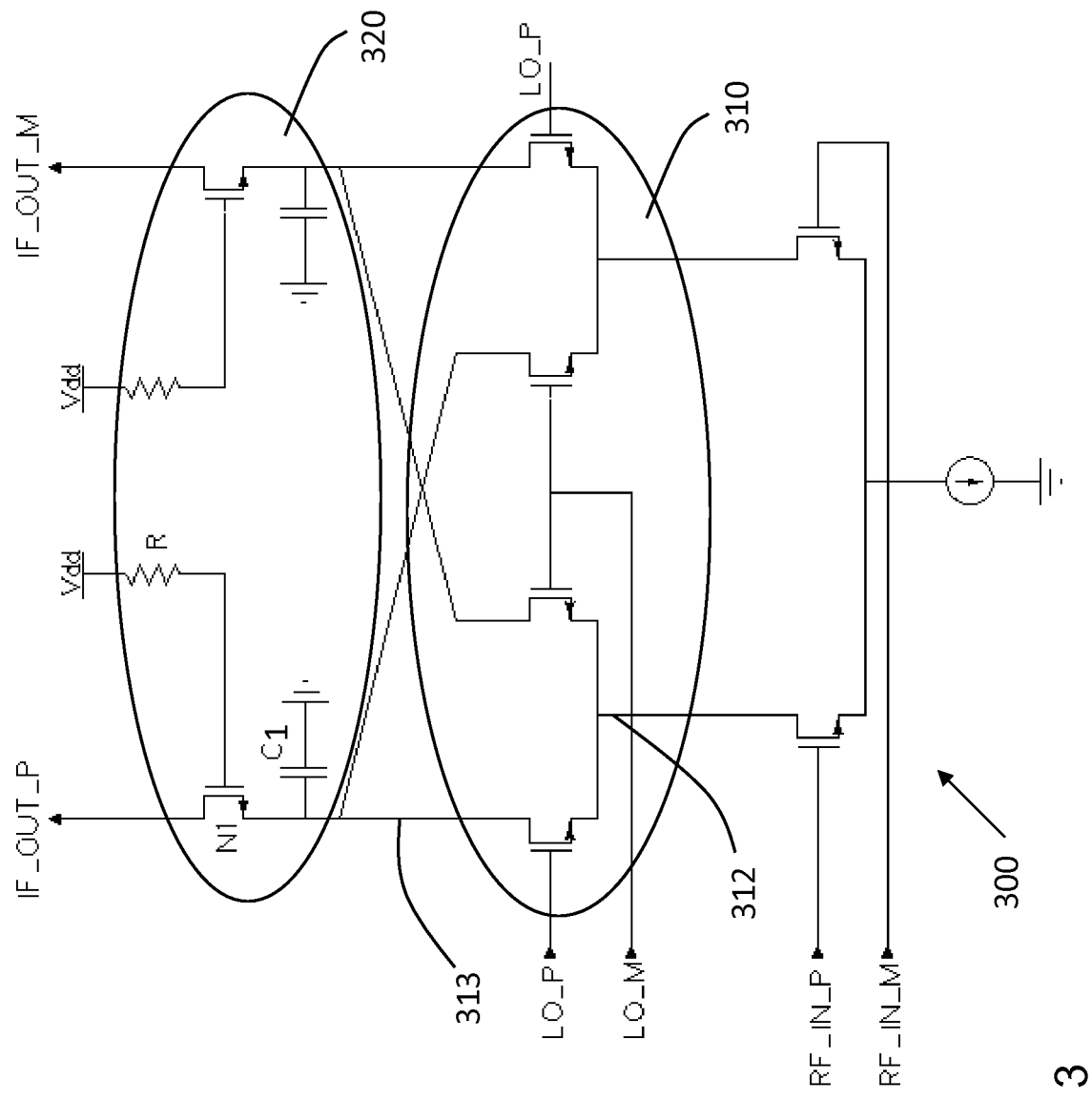
FIG. 3 is a schematic view illustrating a combined mixer and filter circuitry according to embodiments herein for frequency down-converting.

FIG. 3 shows a combined mixer and filter circuitry 300 according to embodiments herein for down-converting. The combined mixer and filter circuitry 300 comprises a mixer 310 comprising a first input LO_ p/LO_M, a second input 312 and an output 313.

The combined mixer and filter circuitry 300 further comprises a filter 320 comprising an active inductor and a first capacitor C1, wherein the active inductor may be implemented by NMOS or PMOS transistor as shown in FIG. 1a and 1b or by bi-polar transistor. The active inductor comprises a transistor N1 having a first, i.e. gate/base, terminal, a second, i.e. drain/collector, terminal and a third, i.e. source/emitter, terminal and a resistor R. The resistor R is connected between the first/gate/base terminal of the transistor N1 and a voltage potential. As shown in FIG. 1a and 1b, for NMOS implementation, the voltage potential is a voltage supply Vdd. For PMOS implementation, the voltage potential is a signal ground. The first capacitor C1 is connected between the third/source/emitter terminal and a signal ground.

The third/source terminal of the transistor is connected to the output of the mixer.

The combined mixer and filter circuitry 300 is therefore a frequency down-converter with a low-pass filter.

Figure 4:
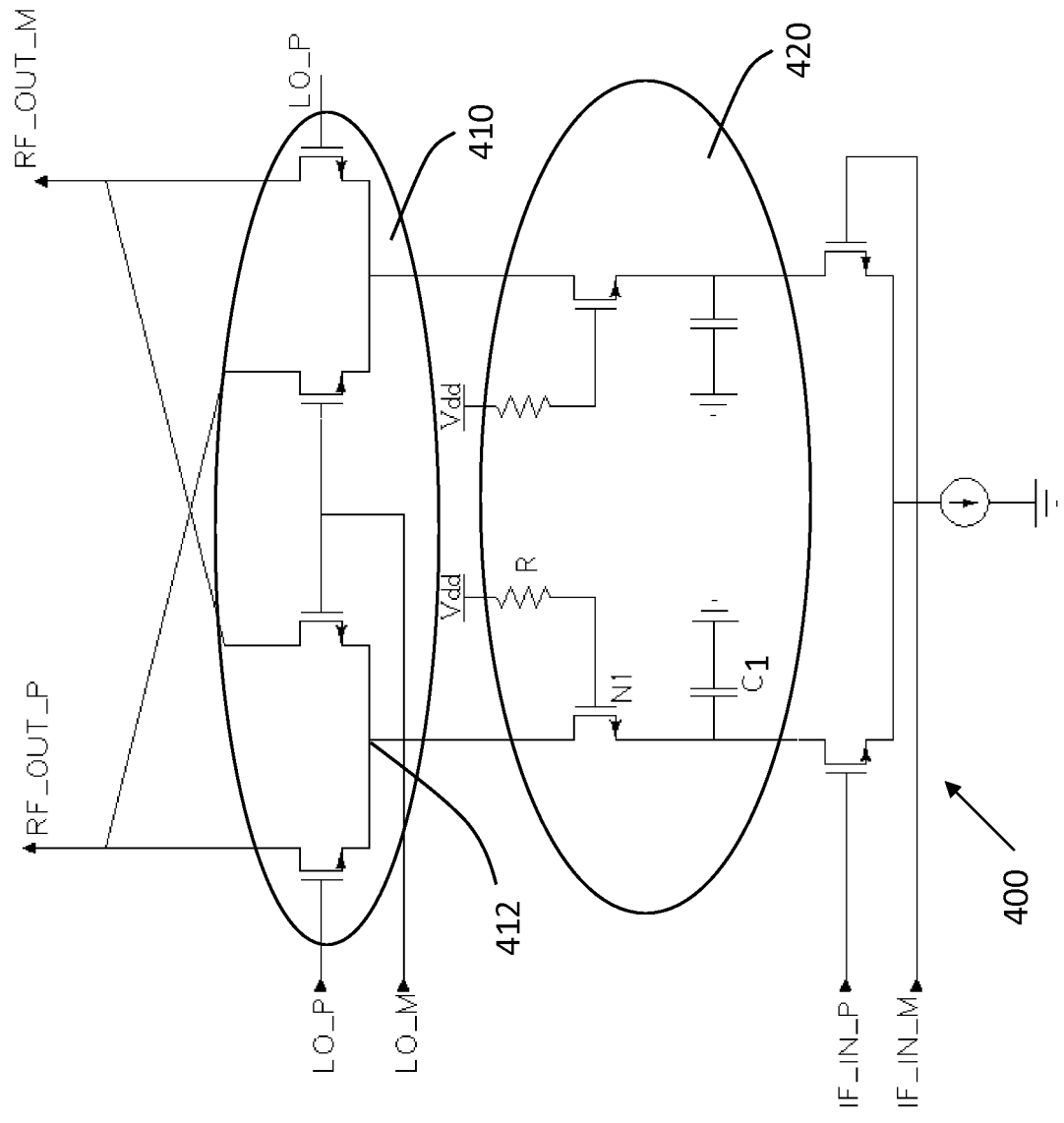
FIG. 4 is a schematic view illustrating a combined mixer and filter circuitry according to embodiments herein for frequency up-converting.

FIG. 4 shows a combined mixer and filter circuitry 400 according to embodiments herein for up-converting. The combined mixer and filter circuitry 400 comprises a mixer 410 comprising a first, i.e. local oscillator LO_P/LO_M, input, a second input 412, i.e. a baseband signal input, and an output RF_OUT_P/RF_OUT_M.

The combined mixer and filter circuitry 400 further comprises a filter 420 comprising an active inductor and a first capacitor C1. The active inductor comprises a transistor N1 having a first/gate/base terminal, a second/drain/collector terminal and a third/source/emitter terminal and a resistor R connected between the first/gate/base input of the transistor and a voltage potential. The first capacitor C1 is connected between the third/source/emitter terminal and a signal ground. Further the second/drain/collector terminal of the transistor N1 is connected to the second input of the mixer 410, as shown in FIG. 4.

The combined mixer and filter circuitry 400 is therefore a frequency up-converter with a low-pass filter.

Figure 5:
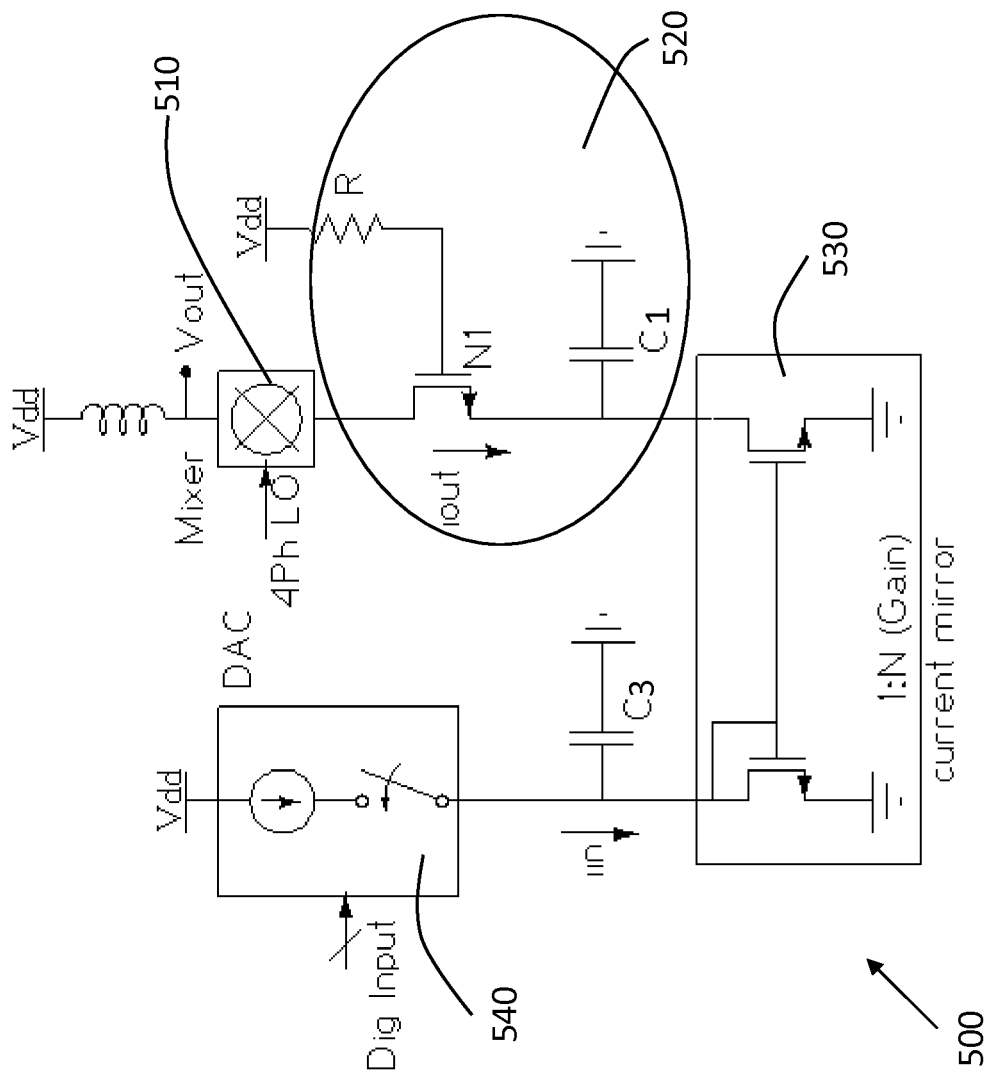
FIG. 5 is a schematic view illustrating an example of a combined mixer and filter circuitry integrated with digital-to-analog converter.

FIG. 5 shows an up-converter 500, i.e. a combined mixer and filter circuitry integrated with a digital-to-analog converter. The combined mixer and filter circuitry 500 comprises a mixer 510 and a filter 520. The combined mixer and filter circuitry 500 further comprises a current mirror 530, a digital to analog converter (DAC) 540 and a second capacitor C2. An output of the current mirror 530 is coupled to the second input of the mixer 510 via the filter 520. The digital to analog converter 540 is configured to receive a digital word and deliver a current to the current mirror 530, and the second capacitor C2 is connected between an input of the current mirror 530 and the signal ground.

Depending on the digital word, DAC delivers an output current, which is amplified by the current mirror 530 and fed to the mixer 510. As can be seen, filtering is done by the first and second capacitors C1, C3, the transistor N1 and the resistor R.

As described before, the transistor N1, the resistor R and the first capacitor C1 are used to generate a complex pole pair. The real-valued parasitic zero, arising due to transistor's Cgd, is mitigated by the real-valued pole generated by the second capacitor C3, resulting a second order filter in total.

The filter topology according to embodiments herein fits very well to the DAC and mixer current interfaces. The complex poles are generated without consuming any extra current and bandwidth is inherently high.

Figure 6:
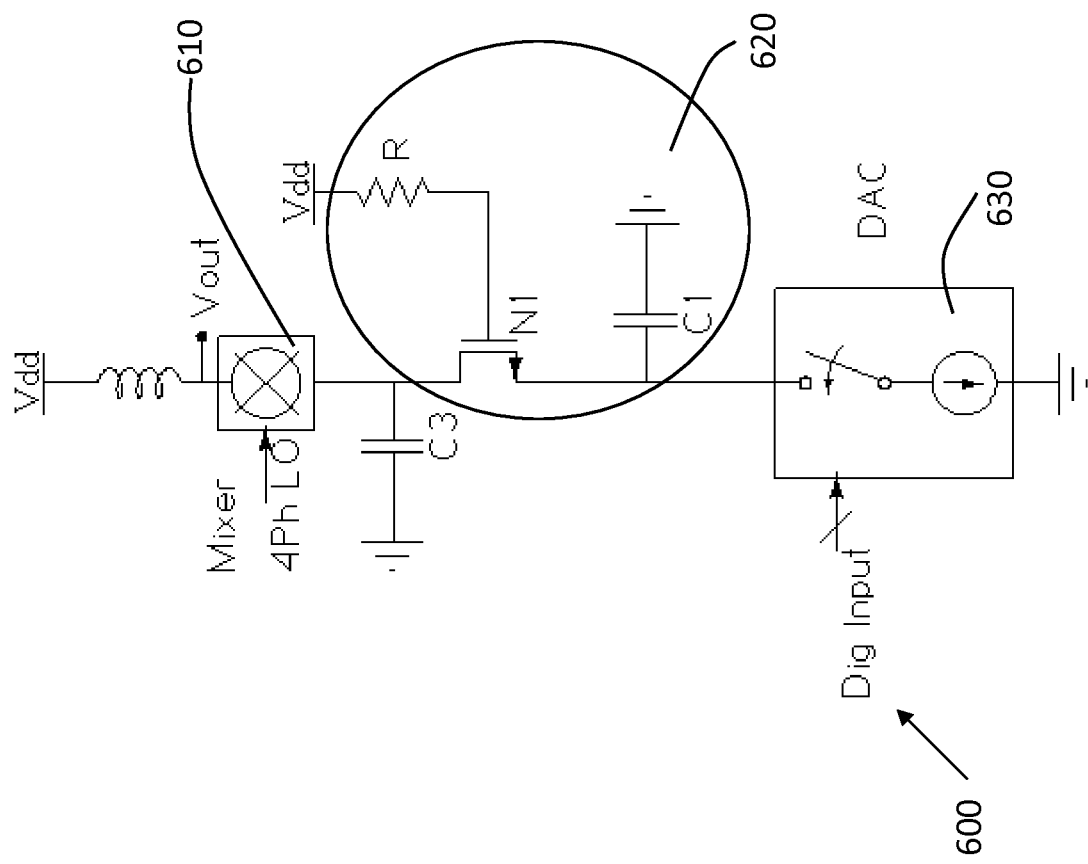
FIG. 6 is a schematic view illustrating another example of a combined mixer and filter circuitry integrated with digital-to-analog converter.

FIG. 6 shows an alternative embodiment to the embodiment shown in FIG. 5. In this embodiment, the current mirror is not necessary. The DAC 630 may be connected directly to the input of the filter 620. It may be implemented if there is enough voltage supply headroom, i.e. Vdd is high. Then DAC 630, the filter 620 and mixer 610 may use the same DC current. A second capacitor C3 is connected between the second input of the mixer 610 and the signal ground. The digital to analog converter 630 is configured to receive a digital word and deliver a current to the filter 620.

As shown in FIGS. 3, 4, 5, 6, the mixers 310, 410, 510, 610 may be current-mode mixers, and the current-mode mixers may be gilbert cell mixers.

Although the embodiments 300, 400, 500, 600 shown in FIGS. 3-6, are implemented using NMOS transistors, PMOS, bi-polar implementation are also possible both for the mixers 310, 410, 510, 610 and active inductors 320, 420, 520, 620.

To summarize, according to the embodiments herein, a low pass filter is implemented by using Hara's active inductor. This makes it possible to generate complex poles with moderate inductor quality factor (Q). Some advantages of the embodiments herein are for examples:

In the combined mixer and filter circuitry 300, 400, 500, 600, the filter is combined with the mixer, so it re-uses DC currents of the existing blocks, and has virtually no current consumption.

The filter can reaches high bandwidth by virtually consuming no extra current. It may only require about 200 mV voltage supply headroom depending on the required Q of the complex poles.

The filter inherently has high bandwidth, as the traditional trade-off between bandwidth and current consumption does not exist in this topology.

Further, bandwidth may be scalable by switching capacitors and resistors, which makes it possible to fit into different products having various IBWs.

The solution according to embodiments herein is robust compared to op-amp based solutions, since there no feedback loops, neither differential nor common mode, which eliminates stability issues.

The filter is simple, no bias voltages and reference currents etc. are required

Figure 7:
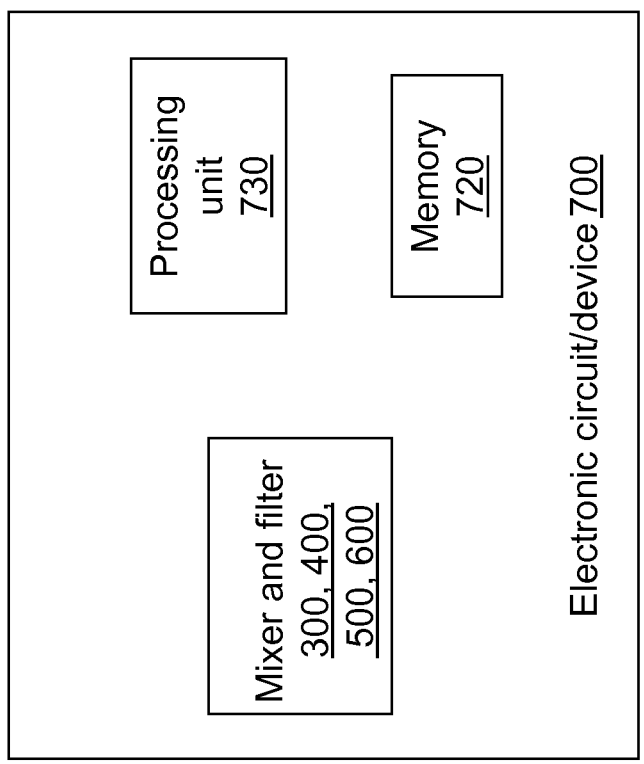
FIG. 7 is a block diagram illustrating an electronic device in which embodiments herein may be implemented.

The combined mixer and filter circuitry 300, 400, 500, 600 according to the embodiments herein may be employed in various electronic devices. FIG. 7 shows a block diagram for an electronic device 700. The electronic device 700 comprises a combined mixer and filter circuitry 300, 400, 500, 600. The electronic device 700 may be a transmitter, a receiver or a transceiver etc. in a cellular communications network. The electronic device 700 may comprise other units, where a memory 720, a processing unit 730 are shown. The electronic device 700 may be implemented in an electronic apparatus. The electronic apparatus may be a user equipment or a mobile device, a wireless communication device, a radio base station for a cellular communication system.

Those skilled in the art will understand that the according to embodiments herein the combined mixer and filter circuitry 300, 400, 500, 600 may be implemented by any semiconductor technology, e.g. Bi-polar, NMOS, PMOS, CMOS or Micro-Electro-Mechanical Systems (MEMS) technology etc.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A combined mixer and filter circuitry, comprising:
   a mixer comprising a first input, a second input, and an output;
   a filter comprising:
      an active inductor, the active inductor comprising a transistor having a first terminal, a second terminal, and a third terminal, and a resistor connected between the first terminal of the transistor and a voltage potential; and
      a first capacitor connected between the third terminal and a signal ground; and
   a current mirror, a digital to analog converter, and a second capacitor;
   wherein the second terminal of the transistor is connected to the second input of the mixer;
   wherein an output of the current mirror is coupled to the second input of the mixer via the filter;
   wherein the digital to analog converter is configured to receive a digital word and deliver a current to the current mirror; and
   wherein the second capacitor is connected between an input of the current mirror and the signal ground.

2. The combined mixer and filter circuitry of claim 1, wherein the mixer is a current-mode mixer.

3. The combined mixer and filter circuitry of claim 2, wherein the current-mode mixer is a gilbert cell mixer.

4. A combined mixer and filter circuitry, comprising:
   a mixer comprising a first input, a second input, and an output;
   a filter comprising:
      an active inductor, the active inductor comprising a transistor having a first terminal, a second terminal, and a third terminal, and a resistor connected between the first terminal of the transistor and a voltage potential; and
      a first capacitor connected between the third terminal and a signal ground; and
   a digital to analog converter and a second capacitor;
   wherein the second terminal of the transistor is connected to the second input of the mixer;
   wherein the digital to analog converter is configured to receive a digital word and deliver a current to the filter; and
   wherein the second capacitor is connected between the second input of the mixer and the signal ground.

5. An electronic apparatus, comprising:
   a combined mixer and filter circuitry, the combined mixer and filter circuitry comprising a mixer and a filter;
   wherein the mixer comprise a first input, a second input, and an output;
   wherein the filter comprises:
      an active inductor, the active inductor comprising a transistor having a first terminal, a second terminal, and a third terminal, and a resistor connected between the first terminal of the transistor and a voltage potential; and
      a first capacitor connected between the third terminal and a signal ground;
   wherein the second terminal of the transistor is connected to the second input of the mixer; and
   a current mirror, a digital to analog converter, and a second capacitor;
   wherein an output of the current mirror is coupled to the second input of the mixer via the filter;
   wherein the digital to analog converter is configured to receive a digital word and deliver a current to the current mirror; and wherein the second capacitor is connected between an input of the current mirror and the signal ground.

6. The electronic apparatus of claim 5, wherein the electronic apparatus is a wireless communication device for a cellular communication system.

7. The electronic apparatus of claim 5, wherein the electronic apparatus is a radio base station for a cellular communication system.

8. An electronic apparatus, comprising:
a combined mixer and filter circuitry, the combined mixer and filter circuitry comprising a mixer and a filter;
wherein the mixer comprise a first input, a second input, and an output;
wherein the filter comprises:
an active inductor, the active inductor comprising a transistor having a first terminal, a second terminal, and a third terminal, and a resistor connected between the first terminal of the transistor and a voltage potential; and
a first capacitor connected between the third terminal and a signal ground;
wherein the second terminal of the transistor is connected to the second input of the mixer; and
a digital to analog converter and a second capacitor;
wherein the digital to analog converter is configured to receive a digital word and deliver a current to the filter; and
wherein the second capacitor is connected between the second input of the mixer and the signal ground.

\* \* \* \* \*